(12) United States Patent
Lee

(10) Patent No.: US 12,183,689 B2
(45) Date of Patent: Dec. 31, 2024

(54) CERAMIC SUBSTRATE AND MANUFACTURING METHOD THEREFOR

(71) Applicant: Amosense Co., Ltd., Cheonan (KR)

(72) Inventor: Ji-Hyung Lee, Cheonan (KR)

(73) Assignee: AMOSENSE CO., LTD., Cheonan-Si (KR)

( * ) Notice: Subject to any disclaimer, the term of this patent is extended or adjusted under 35 U.S.C. 154(b) by 550 days.

(21) Appl. No.: 17/607,724

(22) PCT Filed: Apr. 28, 2020

(86) PCT No.: PCT/KR2020/005595
§ 371 (c)(1),
(2) Date: Oct. 29, 2021

(87) PCT Pub. No.: WO2020/222501
PCT Pub. Date: Nov. 5, 2020

(65) Prior Publication Data
US 2022/0208697 A1    Jun. 30, 2022

(30) Foreign Application Priority Data

May 2, 2019    (KR) .................. 10-2019-0051775

(51) Int. Cl.
*H01L 23/00*    (2006.01)
*H01L 21/48*    (2006.01)
*H01L 23/373*    (2006.01)

(52) U.S. Cl.
CPC ........ *H01L 23/562* (2013.01); *H01L 21/4807* (2013.01); *H01L 23/3735* (2013.01)

(58) Field of Classification Search
CPC ..... H01L 21/4807; H01L 23/02; H01L 23/28; H01L 23/562
See application file for complete search history.

(56) References Cited

U.S. PATENT DOCUMENTS 9,698,335 B2 * 7/2017 Palermo ............... H10N 30/802
2013/0186677 A1    3/2013 Lee

FOREIGN PATENT DOCUMENTS

| JP | 07086703 A | 4/2007 | |
| KR | 100731604 B1 | 6/2007 | |
| KR | 101053141 B1 | 8/2011 | |
| KR | 20190022383 A | 3/2019 | |
| WO | WO-2011111989 A2 * | 9/2011 | ........... C04B 37/026 |
| WO | 2017155249 A1 | 9/2017 | |
| WO | WO-2019039883 A1 * | 2/2019 | ......... H01L 21/4882 |

OTHER PUBLICATIONS

International Search Report and Written Opinion from related PCT Application No. PCT/KR2020/005595, dated Jul. 30, 2020, 10 pages.

* cited by examiner

*Primary Examiner* — Walter H Swanson
*Assistant Examiner* — Jacob T Nelson
(74) *Attorney, Agent, or Firm* — Brooks, Cameron & Huebsch, PLLC

(57) ABSTRACT

Provided are a ceramic substrate and a method of manufacturing the same, which suppress a warpage phenomenon caused by a difference in volumes occupied by upper and lower metal layers of a ceramic base material and controls areas of the upper and lower metal layers especially when thicknesses of the upper and lower metal layers on the ceramic base material are equal to each other, thereby reducing a defect rate of the ceramic substrate.

13 Claims, 9 Drawing Sheets

CERAMIC SUBSTRATE AND MANUFACTURING METHOD THEREFOR

TECHNICAL FIELD

The present invention relates to a ceramic substrate and a method of manufacturing the same, and particularly to a ceramic substrate and a method of manufacturing the same, which are for preventing the ceramic substrate from warpage by controlling volume and area ratios of upper and lower metal layers.

BACKGROUND ART

Ceramic substrate are formed by integrally attaching a metal foil such as copper foil to a ceramic base material. The ceramic substrates are produced through a manufacturing processes such as active metal brazing (AMB), direct bond copper (DBC), and the like, and may be classified into a ceramic AMB substrate, a ceramic DBC substrate, and the like according to differences in manufacturing processes.

The ceramic DBC substrate is manufactured by a process of directly bonding an oxidizable metal to a ceramic base material, whereas the ceramic AMB substrate is manufactured by brazing an active metal to a ceramic base material to form a layer and brazing a metal to a brazing layer.

Also, in general, in both processes, a metal layer is formed, a photolithography process is performed, and then etching is performed to form a pattern layer.

However, in forming metal layers on both surfaces of a ceramic base material, a difference in areas or thicknesses of the metal layers may occur according to pattern arrangement of both surfaces, and when the difference is greater than a certain ratio, warpage of a ceramic substrate may occur in a high-temperature environment.

As a result, when a degree of warpage is greater than 0.4%, the ceramic substrate may be a defect and inevitably discarded, and its occurrence ratio occupies a relatively large proportion in the total production, causing a continuous production loss.

According to empirical data, when a volume ratio of both metal layers reaches a range of 75% to 85%, it has been confirmed that a degree of warpage is greater than 0.4%.

As in an example of FIG. 1, when volume ratios of a metal layer 2 formed on an upper surface of a ceramic base material 1 and a metal layer 3 formed on a lower surface of the ceramic base material 1 are out of appropriate ranges, a ceramic substrate 10 is warped in a high-temperature environment, in this case, a case where a volume of the metal layer 3 is greater than that of the metal layer 2 is referred to as negative warpage, and negative warpage occurs more than positive warpage, which is opposite to the negative warpage.

However, increasing a thickness of the ceramic base material 1 is not economical and thus there is a limit, and it is often difficult to maintain the upper and lower metal layers 2 and 3 at the same thickness ratio in design.

DISCLOSURE

Technical Problem

The present invention has been devised to solve the above problems, and an objective of the present invention is to provide a ceramic substrate and a method of manufacturing the same, which suppress a warpage phenomenon caused by a difference in volumes occupied by upper and lower metal layers of a ceramic base material and controls areas of the upper and lower metal layers especially when thicknesses of the upper and lower metal layers on the ceramic base material are equal to each other, thereby reducing a defect rate of the ceramic substrate.

Technical Solution

A ceramic substrate of the present invention includes: a ceramic base material; a first electrode layer formed on the ceramic base material; and a second electrode layer formed under the ceramic base material, and Equation (1) below is satisfied (1).

$$85\% \leq \frac{V_1}{V_2} \leq 105\% \qquad \text{Equation (1)}$$

(Here, $V_1$ refers to a volume of the first electrode layer, and $V_2$ refers to a volume of the second electrode layer.)

Also, the first and second electrode layers of the ceramic substrate have the same thickness, and Equation (2) below is satisfied.

$$85\% \leq \frac{S_1}{S_2} \leq 105\% \qquad \text{Equation (2)}$$

(Here, $S_1$ refers to an area of the first electrode layer, and $S_2$ refers to an area of the second electrode layer.)

Here, either one or both of the first electrode layer and the second electrode layer include a plurality of sub-electrode layers.

Meanwhile, the plurality of sub-electrode layers are separated from each other by a slit.

Also, the slit includes either one or two or more of a first slit vertically dividing an electrode layer and a second slit horizontally dividing an electrode layer.

Also, the ceramic substrate has a camber ratio R, which is defined by Equation (3) below, of 0.4% or less.

$$R = \frac{T-t}{L} \times 100 \qquad \text{Equation (3)}$$

(Here, T refers to a minimum length from a highest position of the ceramic substrate to a plane when the ceramic substrate is arranged on the plane, t refers to a thickness of the ceramic substrate, and L refers to a length of the ceramic substrate.)

Here, further included is a bonding layer on either one side or both sides between the ceramic base material and the first electrode layer and between the ceramic base material and the second electrode layer.

Also, a relationship between ($T-t_0$), which is a difference between a minimum length T from a highest position of the ceramic substrate to a plane and a thickness to of the ceramic substrate, and a length ($L_0$) of the ceramic substrate satisfies Equation (4) below.

$$T-t_0 \leq 0.004 L_0 \qquad \text{Equation (4)}$$

Here, the ceramic base material is selected from alumina, aluminum nitride, silicon nitride, and ZTA.

Also, the ceramic substrate is used in either one of vehicle engines, wind turbines, and high voltage DC transmission apparatuses.

A method of manufacturing a ceramic substrate of the present invention includes: preparing a ceramic base material; forming a first electrode layer on the ceramic base material; and forming a second electrode layer under the ceramic base material, and Equation (1) below is satisfied.

$$85\% \leq \frac{V_1}{V_2} \leq 105\% \qquad \text{Equation (1)}$$

(Here, $V_1$ refers to a volume of the first electrode layer, and $V_2$ refers to a volume of the second electrode layer.)

Also, a thickness of the first electrode layer and a thickness of the second electrode layer are equal to each other, and Equation (2) below is satisfied.

$$85\% \leq \frac{S_1}{S_2} \leq 105\% \qquad \text{Equation (2)}$$

(Here, $S_1$ refers to an area of the first electrode layer, and $S_2$ refers to an area of the second electrode layer.)

Here, the ceramic substrate is manufactured by a process of either one of active metal brazing (AMB) or direct bond copper (DBC).

Meanwhile, either one or both of the first electrode layer and the second electrode layer include a plurality of sub-electrode layers.

Also, either one or both of the first electrode layer and the second electrode layer are divided by a slit.

Also, further included is, prior to forming the first electrode layer and the second electrode layer respectively on and under the ceramic base material, after dividing either one or both of the first electrode layer and the second electrode layer into a sub-electrode layer, forming the sub-electrode layer on the ceramic base material.

Also, further included is, after forming the first electrode layer and the second electrode layer on the ceramic base material, dividing either one or both of the first electrode layer and the second electrode layer into a sub-electrode layer.

Here, the dividing into the sub-electrode layer includes either one of cutting, etching, and molding of the first electrode layer and the second electrode layer.

Also, when the dividing into the sub-electrode layer includes etching of an electrode layer with an etchant, the etchant may include either one or two selected from ferric chloride and copper chloride.

Also, the first electrode layer and the second electrode layer may be formed respectively on and under the ceramic base material so that a camber ratio R defined by Equation (3) below is adjusted to 0.4 or less.

$$R = \frac{T-t}{L} \times 100 \qquad \text{Equation (3)}$$

(Here, T refers to a minimum length from a highest position of the ceramic substrate to a plane when the ceramic substrate is arranged on the plane, t refers to a thickness of the ceramic substrate, and L refers to a length of the ceramic substrate.)

Advantageous Effects

According to a ceramic substrate and a method of manufacturing the same of the present invention, a difference in volumes of metal layers formed on upper and lower portions of a ceramic base material can be controlled within a certain range, or areas of upper and lower metal layers can be controlled when thicknesses of the upper and lower metal layers on the ceramic base material are equal to each other, thereby reducing a camber value of the ceramic substrate.

Accordingly, the ceramic substrate can be manufactured without warpage even under a high-temperature environment, and furthermore, a defect rate of the ceramic substrate can be improved, thereby improving processability and productivity.

MODE FOR INVENTION

Ceramic Substrate

Figure 1:
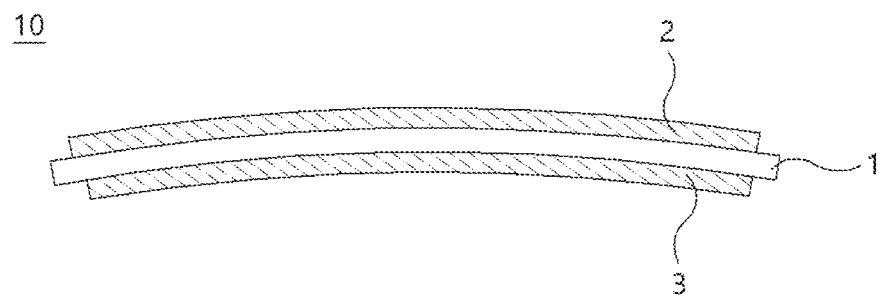
FIG. 1 is a cross-sectional view of a ceramic substrate in which warpage has occurred.
Figure 2:
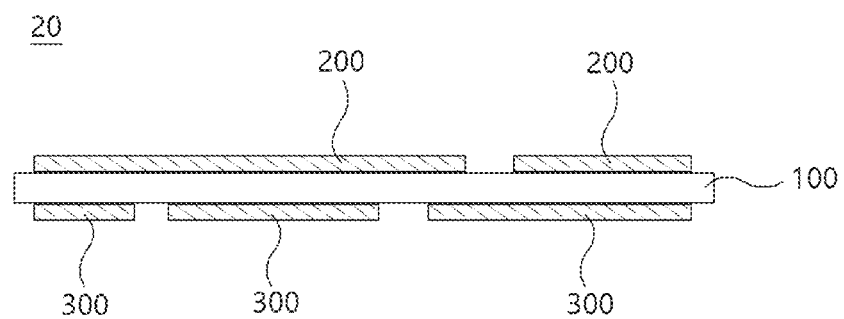
FIG. 2 is a cross-sectional view of a ceramic substrate of the present invention.

As shown in FIG. 2, a ceramic substrate 20 according to the present invention may include: a ceramic base material 100; a first electrode layer 200 formed on the ceramic base material 100; and a second electrode layer 300 formed under the ceramic base material 100. Here, volumes of the first electrode layer 200 and the second electrode layer 300 should be within certain ranges to suppress warpage of the ceramic substrate 20.

For example, in a case where a volume of the first electrode layer 200 is defined as $V_1$ and a volume of the second electrode layer 300 is defined as $V_2$, when Equation (1) below is satisfied, warpage of the ceramic substrate 20 may be significantly reduced.

$$85\% \leq \frac{V_1}{V_2} \leq 105\% \qquad \text{Equation (1)}$$

Also, due to the design of the ceramic substrate 20, it is necessary to use the first and second electrode layers 200 and 300 having the same thickness. In this case, according to pattern shapes of the first electrode layer 200 and the second electrode layer 300, a difference in areas thereof may occur, and the need to prevent warpage of the ceramic substrate 20 increases.

For example, in a case where an area of the first electrode layer 200 is defined as $S_1$ and an area of the second electrode layer 300 is defined as $S_2$, when Equation (2) is satisfied, warpage of the ceramic substrate 20 may be significantly reduced.

$$85\% \le \frac{S_1}{S_2} \le 105\%$$ Equation (2)

That is, when a ratio of $S_1$ to $S_2$ is less than 85%, negative warpage is likely to occur, and a camber ratio, which indicates a degree of occurrence of warpage, is greater than 0.4%. Also, when a ratio of $S_1$ to $S_2$ is greater than 115%, positive warpage is likely to occur. However, because there are many cases where an area of the second electrode layer 300 is similar to or less than that of the first electrode layer 200 due to the design of the ceramic substrate 20, when a ratio of $S_1$ to $S_2$ is less than or equal to 105%, the ceramic substrate 20 may be manufactured without occurrence of positive warpage.

Meanwhile, the ceramic substrate 20 may include a bonding layer (not shown) between the ceramic base material 100 and the first electrode layer 200 or between the ceramic base material 100 and the second electrode layer 300. For example, a bonding layer may be formed on both sides between the ceramic base material 100 and the first electrode layer 200 and between the ceramic base material 100 and the second electrode layer 300, or a bonding layer may be formed on either one side between the ceramic base material 100 and the first electrode layer 200 and between the ceramic base material 100 and the second electrode layer 300.

The ceramic base material 100 may be either one selected from alumina, aluminum nitride, silicon nitride, and ZTA, but is not limited thereto.

The first electrode layer 200 and the second electrode layer 300 may include one selected from silver (Ag), copper (Cu), tungsten (W), molybdenum (Mo), and nickel (Ni), or an alloy thereof. Preferably, copper (Cu) or an alloy thereof may be used.

A first electrode layer is a connecting electrode of an electronic device, and is frequently designed with fixed shape, thickness, length, or the like on a ceramic substrate. Here, a slit of the second electrode layer is adjusted, and thus, volume ratios or area ratios of the first electrode layer and the second electrode layer may be controlled. That is, when a plurality of sub-electrode layers are formed by using a plurality of slits in the second electrode layer, a volume and area of the second electrode layer decrease, resulting in a decrease in a volume ratio and area ratio of the second electrode layer to the first electrode layer. In order to design the ceramic substrate as described above, the second electrode layer may have various shapes.

Figure 3A:
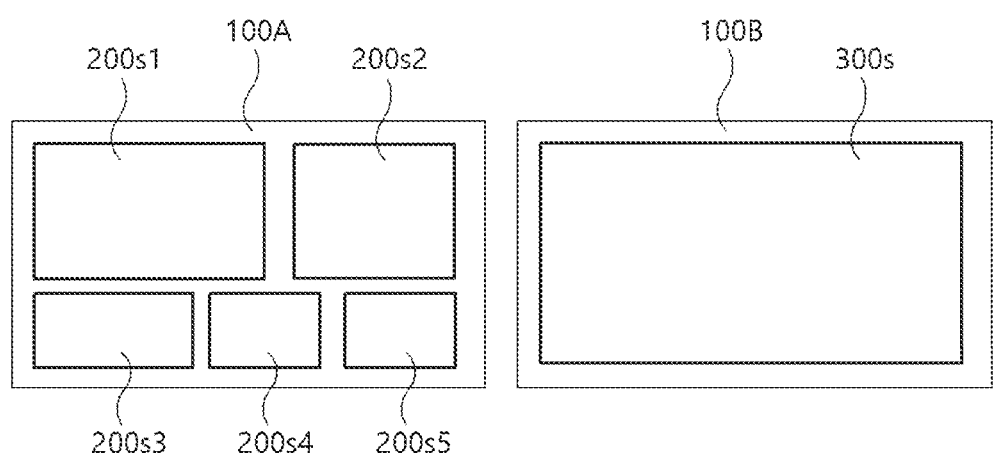
FIG. 3 is an upper and lower view of a ceramic substrate in which an electrode layer is formed on a ceramic base material.
Figure 3B:
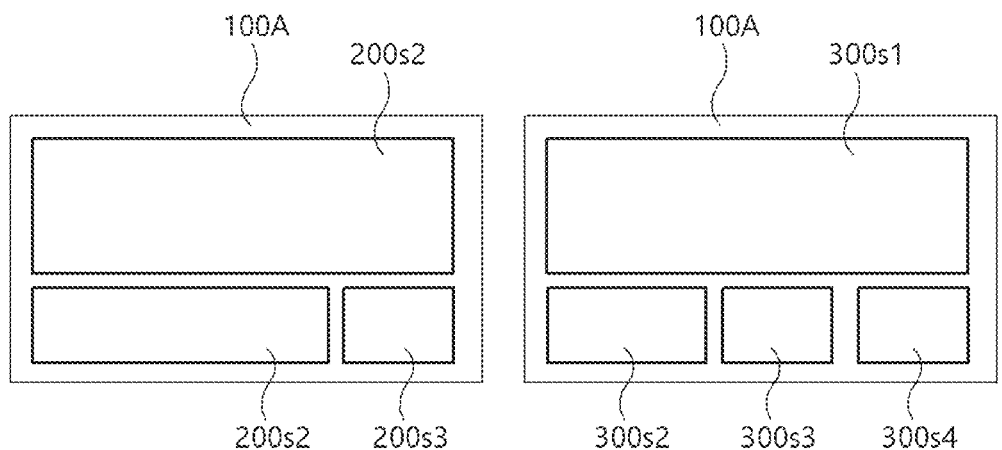

As shown in (a) of FIG. 3, a first electrode layer formed on a ceramic base material 100A may include a plurality of sub-electrode layers 200s1, 200s2, 200s3, 200s4, and 200s5, and a second electrode layer formed under a ceramic base material 100B may include a single electrode layer 300S. Alternatively, as shown in (b) of FIG. 3, a first electrode layer formed on the ceramic base material 100A may include a plurality of sub-electrode layers 200s1, 200s2, and 200s3, and a second electrode layer formed under the ceramic base material 100B may include a plurality of sub-electrode layers 300s1.300s2, 300s3, and 300s4.

Figure 4A:
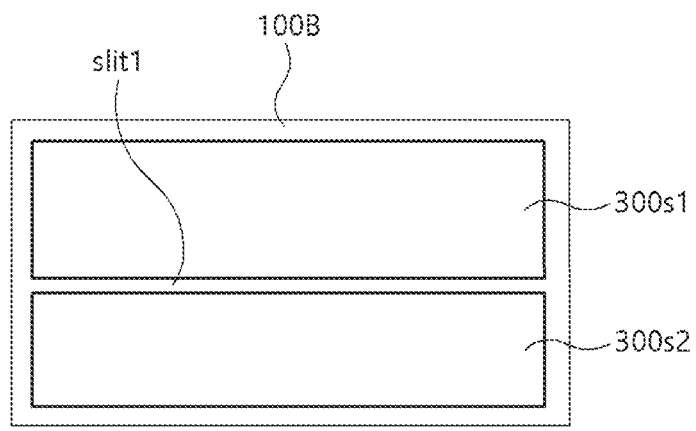
FIGS. 4 and 5 are each a lower view of a ceramic substrate in which an electrode layer is formed on a ceramic base material.
Figure 4B:
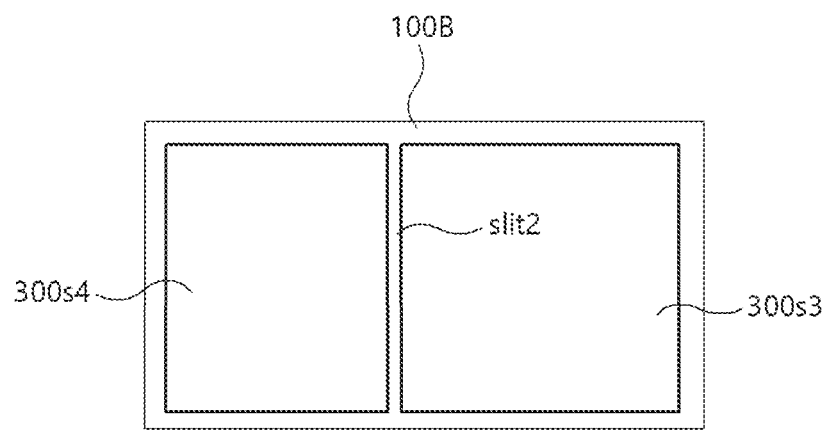
Figure 4C:
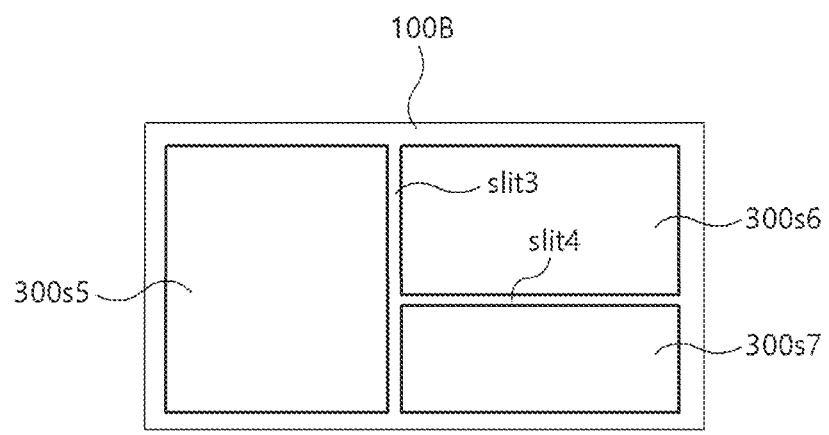

Also, as shown in FIG. 4, a slit separating an area of a sub-electrode layer may have various shapes. For example, as shown in (a) of FIG. 4, a sub-electrode layer 300s1 and a sub-electrode layer 300s2 may be separated from each other by a slit slit1 vertically dividing a single electrode layer, and as shown in (b) of FIG. 4, a sub-electrode layer 300s3 and a sub-electrode layer 300s4 may be separated from each other by a slit slit2 horizontally dividing a single electrode layer.

Also, as shown in (c) of FIG. 4, sub-electrode layers 300s5, 300s6, and 300s7 may be separated from each other by a slit slit3 horizontally dividing a single electrode layer and a slit slit4 vertically dividing a single electrode layer.

That is, the second electrode layer is divided by a slit to adjust a volume ratio and area ratio of the second electrode layer, and thus, volume ratios and area ratios of the first electrode layer and the second electrode layer may be controlled.

Next, as another example for controlling a volume ratio and area ratio of the second electrode layer, a spacing of a slit is adjusted while a shape of a sub-electrode layer is maintained, and thus, volume ratios and area ratios of the first electrode layer and the second electrode layer may be controlled.

That is, when a slit spacing of the second electrode layer is widened, a volume and area of the second electrode layer decrease, and a volume and area of the second electrode layer to the first electrode layer decrease.

Figure 5A:
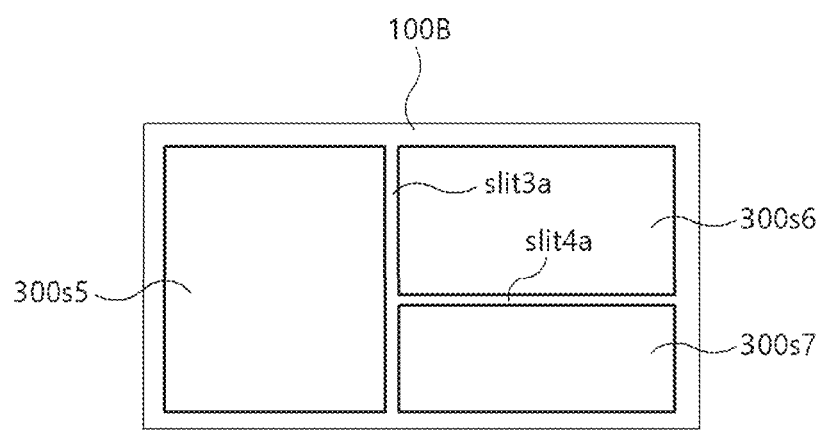
Figure 5B:
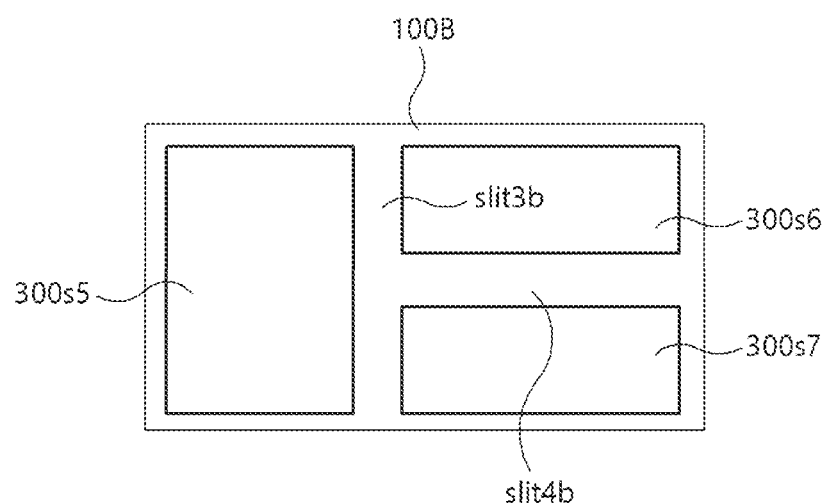
Figure 5C:
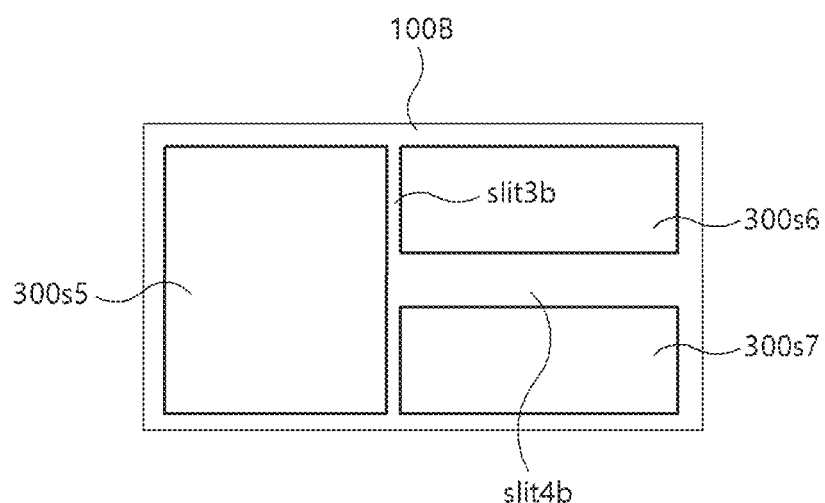

As shown in (a) of FIG. 5, a slit slit3a horizontally dividing a single electrode layer and a slit slit4a vertically dividing a single electrode layer may separate sub-electrode layers 300s5, 300s6, and 300s7 at the same slit spacing, and as shown in (b) of FIG. 5, in order to further reduce a volume and area of the second electrode layer, a slit slit3b and a slit slit4b, which respectively have spacings greater than the slit slit3a and the slit slit4a described in (a) of FIG. 5, may separate sub-electrode layers 300s5, 300s6, and 300s7.

Meanwhile, as shown in (c) of FIG. 5, sub-electrode layers 300s5, 300s6, and 300s7 may be separated from one another by using the slits slit3a and slit4b having various spacings.

In FIGS. 4 and 5, although a slit vertically or horizontally dividing an electrode layer is exemplified to divide the electrode layer into sub-electrode layers, the slit may have an inclined shape or a curved shape.

A camber ratio defined by Equation (3) below may be used as a measurement parameter related to warpage of a ceramic substrate.

$$R = \frac{T - t}{L} \times 100$$ Equation (3)

Figure 6:
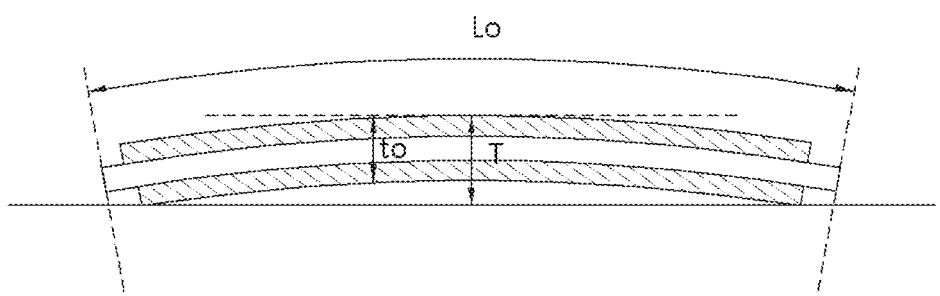
FIG. 6 is a cross-sectional view of a ceramic substrate for explaining a parameter for measuring a camber ratio.

That is, as shown in FIG. 6, when a ceramic substrate is arranged on a plane, T referring to a minimum length from a highest position of the ceramic substrate to the plane, to referring to a thickness of the ceramic substrate, and $L_0$ referring to a length of the ceramic substrate are measured and input to Equation (3), to thereby measure the camber ratio. Here, in order to obtain a more accurate value of the camber ratio, a plurality of points may be measured and an average value thereof may be used.

A camber ratio R of the present invention may be preferably less than or equal to 0.4%, more preferably less than or equal to 0.2%, and most preferably less than or equal to 0.1%. Equations (1) and (2) may be satisfied, thereby satisfying the camber ratio R of the present invention.

A camber ratio, which is a parameter for the occurrence of warpage of a ceramic substrate, may vary according to a relationship between a length and thickness of the ceramic substrate. That is, in a case where the ceramic substrate is warped, when a relationship between a difference (T−$t_0$)

between a minimum length from a highest position of the ceramic substrate to a plane and a thickness of the ceramic substrate and a length ($L_0$) of the ceramic substrate satisfies Equation (4) below, the occurrence of warpage of the ceramic substrate is small, and a defect rate decreases.

$$T - t_0 \leq 0.004 L_0 \quad \text{Equation (4)}$$

A value of ($T-t_0$), which is a difference between a thickness of the ceramic substrate and a minimum length from a highest position of the ceramic substrate to a plane when warpage has occurred, may be preferably less than or equal to $0.004L_0$, more preferably less than or equal to $0.002L_0$, and most preferably less than or equal to $0.001\ L_0$.

Figure 7:
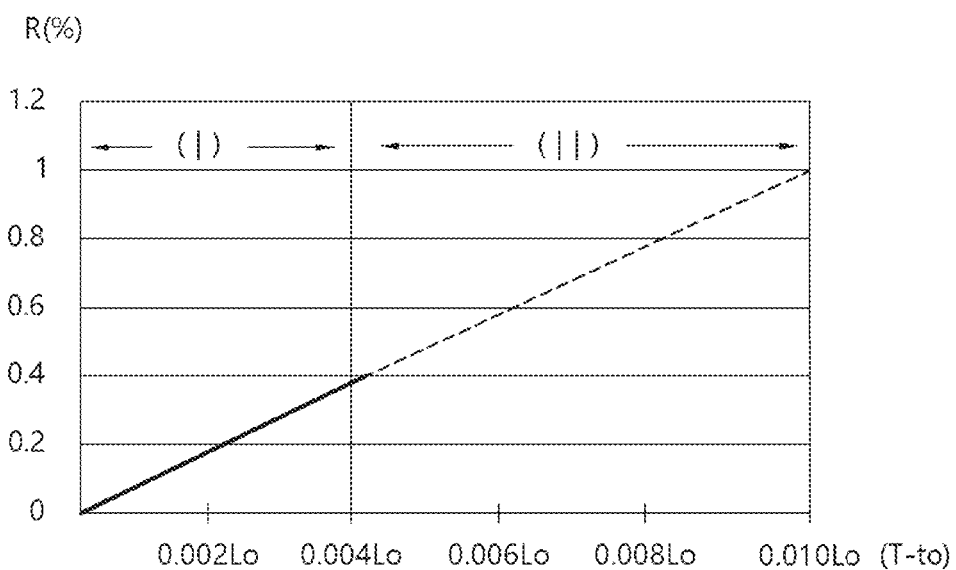
FIG. 7 is a graph for showing an area satisfying a camber ratio of the present invention.

Meanwhile, FIG. 7 is a graph showing a relationship between ($T-t_0$) and $L_0$ in relation to the camber ratio R.

As shown in FIG. 7, a value of ($T-t_0$), which is a difference between a thickness of the ceramic substrate and a minimum length from a highest position of the ceramic substrate to a plane when warpage has occurred, is preferably in a region (1) less than or equal to $0.004L_0$, and a defect due to warpage become a problem in a region (11) greater than $0.004L_0$.

Method of Manufacturing Ceramic Substrate

Hereinafter, a method of manufacturing a ceramic substrate is described.

Figure 8A:
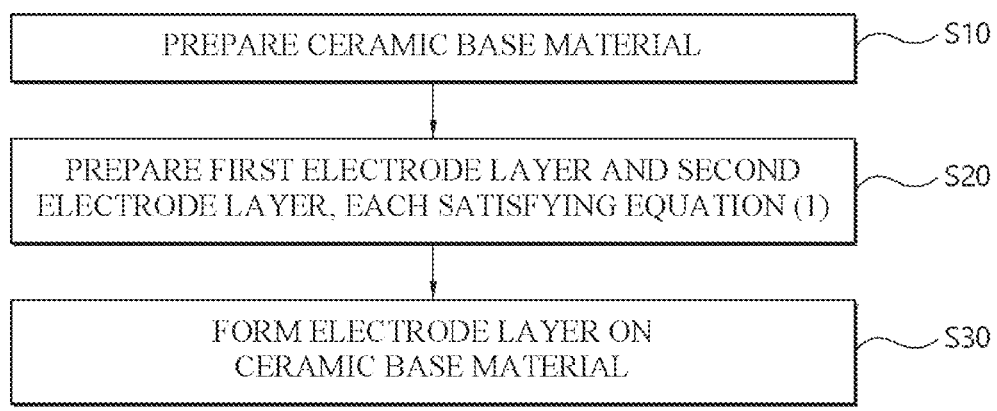
FIG. 8 is a flowchart for explaining a method of manufacturing a ceramic substrate of the present invention.
Figure 8B:
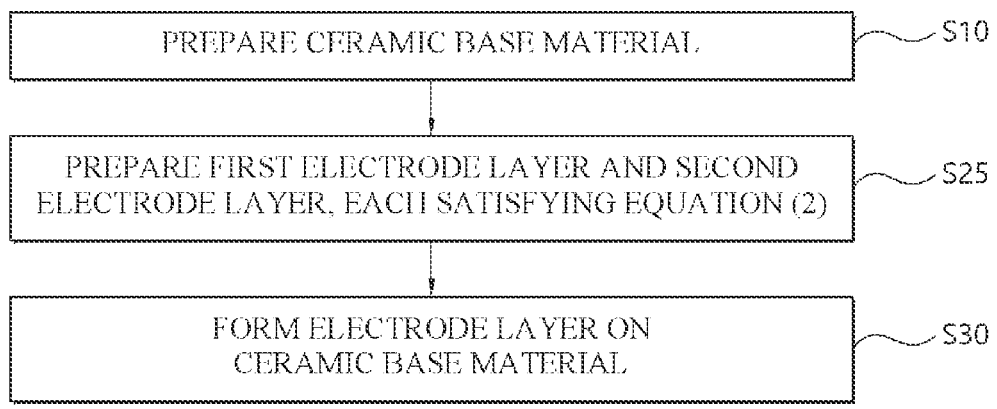

As shown in (a) of FIG. 8, a method of manufacturing a ceramic substrate of the present invention may include: preparing a ceramic base material (operation S10); preparing a first electrode layer and a second electrode layer, each satisfying Equation (1) below (operation S20); and forming the first electrode layer on the ceramic base material and forming the second electrode layer under the ceramic base material (operation S30).

$$85\% \leq \frac{V_1}{V_2} \leq 105\% \quad \text{Equation (1)}$$

(Here, $V_1$ refers to a volume of the first electrode layer, and $V_2$ refers to a volume of the second electrode layer.)

Meanwhile, when a thickness of the first electrode layer and a thickness of the second electrode layer are equal to each other, as shown in (b) of FIG. 8, the method of manufacturing the ceramic substrate of the present invention may include: preparing a ceramic base material (operation S10); preparing the first electrode layer and second electrode layer, each satisfying Equation (2) below (operation S25); and forming the first electrode layer on the ceramic base material and forming the second electrode layer under the ceramic base material (operation S30).

$$85\% \leq \frac{S_1}{S_2} \leq 105\% \quad \text{Equation (2)}$$

(Here, $S_1$ refers to an area of the first electrode layer, and $S_2$ refers to an area of the second electrode layer.)

Here, prior to forming the first electrode layer and the second electrode layer respectively on and under the ceramic base material, after dividing either one or both of the first electrode layer and the second electrode layer into a sub-electrode layer, forming the sub-electrode layer on the ceramic base material may be further included.

The dividing into the sub-electrode layer may include either one of cutting, etching, and molding of the first electrode layer and the second electrode layer, but in terms of productivity, the molding thereof may increase process efficiency. Meanwhile, when a metal layer having a fine pattern is manufactured, an electrode layer may be etched with an etchant. The etchant may include either one or two selected from ferric chloride and copper chloride. Copper chloride may include copper(I) chloride (CuCl) or copper(II) chloride (CuCl2).

Meanwhile, the forming the sub-electrode layer on the ceramic base material may include, prior to forming the first electrode layer and the second electrode layer respectively on and under the ceramic base material, forming the sub-electrode layer, or after forming the first electrode layer and the second electrode layer respectively on and under the ceramic base material, forming the sub-electrode layer by either one of cutting, etching, and molding of either one or both of the first electrode layer and the second electrode layer.

Experimental Example

In Examples 1 to 4, copper metal layers was respectively laminated on upper and lower portions of a ceramic base material to manufacture a ceramic substrate having a thickness of about 2 mm. An upper copper metal layer and a lower copper metal layer of the ceramic base material were of the same thickness. The upper copper metal layer included a plurality of copper sub-electrode layers, and an area of the plurality of copper sub-electrode layers was 596.0242 mm². The lower copper metal layer included a plurality of copper sub-electrode layers, and an area of the plurality of copper sub-electrode layers was 669.3893 mm². An area ratio of the upper copper metal layer to the lower copper metal layer was 89.04%.

Figure 9A:
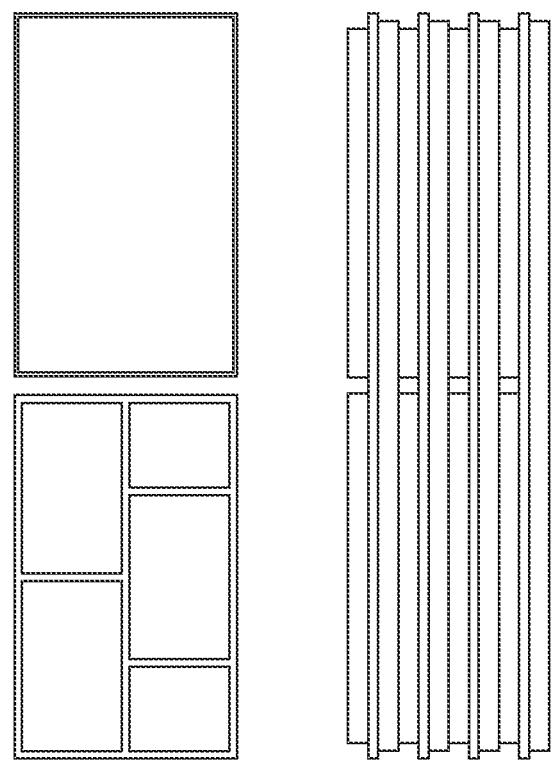
FIG. 9 is images of ceramic substrates showing Example and Comparative Example of the present invention.
Figure 9B:
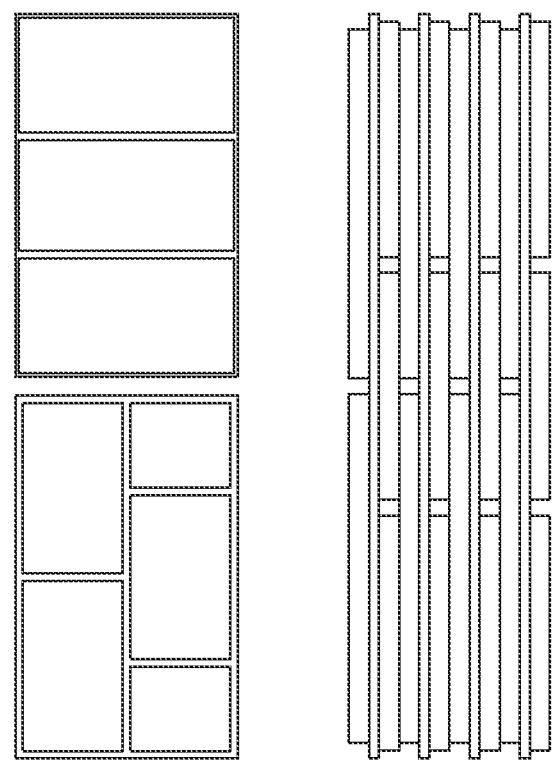

As shown in [Table 1] below, in Examples 1 to 4, a camber ratio showed a value of 0.4% or less, and thus, it was confirmed that the occurrence of warpage of the ceramic substrate was suppressed. As shown in images of ceramic substrates of (a) of FIG. 9, it was confirmed that there was little or very little warpage in the ceramic substrates of Examples 1 to 4.

TABLE 1

| | Example 1 | Example 2 | Example 3 | Example 4 |
|---|---|---|---|---|
| T(mm) | 2.132 | 2.158 | 2.172 | 2.095 |
| $t_0$(mm) | 1.982 | 2.015 | 2.034 | 2.001 |
| T-$t_0$(mm) | 0.15 | 0.143 | 0.138 | 0.094 |
| $L_0$(mm) | 37.5 | 36.7 | 51.1 | 36.2 |
| R(%) | 0.40 | 0.39 | 0.27 | 0.26 |

Meanwhile, in Comparative Examples 1 to 4, copper metal layers was respectively laminated on upper and lower portions of a ceramic base material to manufacture a ceramic substrate having a thickness of about 2 mm. An upper copper metal layer and a lower copper metal layer of the ceramic base material were of the same thickness. The upper copper metal layer included a plurality of copper sub-electrode layers, and an area of the plurality of copper sub-electrode layers was 596.0242 mm². The lower copper metal layer included a single copper electrode layer, and an area of the single copper electrode layer was 759.1348 mm². An area ratio of the upper copper metal layer to the lower copper metal layer was 78.5%.

As shown in [Table 2] below, in Comparative Examples 1 to 4, a camber ratio showed a value greater than 0.61%, and thus, it was confirmed that the occurrence of warpage of the ceramic substrate increased. As shown in images of ceramic substrates of (b) of FIG. 9, it was confirmed that there was warpage in the ceramic substrates of Comparative Examples 1 to 4 and defects occurred.

TABLE 2

|  | Comparative Example 1 | Comparative Example 2 | Comparative Example 3 | Comparative Example 4 |
|---|---|---|---|---|
| T(mm) | 2.291 | 2.258 | 2.335 | 2.31 |
| $t_0$(mm) | 2.035 | 2.047 | 2.047 | 2.037 |
| T-$t_0$(mm) | 0.256 | 0.211 | 0.288 | 0.273 |
| $L_0$(mm) | 35.6 | 34.6 | 34.7 | 34.6 |
| R(%) | 0.72 | 0.61 | 0.83 | 0.79 |

EXPLANATION OF REFERENCED NUMERALS 1, 100: ceramic base material
2, 200: first electrode layer
200s1, 200s2, 200s3, 200s4, 200s5, 200s6, 200s7: sub-electrode layer
3, 300: second metal layer
slit1, slit2, slit3, slit4: slit

The invention claimed is:

1. A ceramic substrate comprising:
a ceramic base material;
a first electrode layer formed on the ceramic base material; and
a second electrode layer formed under the ceramic base material,
wherein Equation (1) below is satisfied:

$$85\% \leq \frac{V_1}{V_2} \leq 105\% \qquad \text{Equation (1)}$$

(wherein, $V_1$ refers to a volume of the first electrode layer, and $V_2$ refers to a volume of the second electrode layer),
wherein a camber ration R defined by Equation (3) below is less than or equal to 0.4%:

$$R = \frac{T-t}{L} \times 100 \qquad \text{Equation (3)}$$

wherein, T refers to a minimum length from a highest position of the entire ceramic substrate including the first electrode and the second electrode to a plane when the ceramic substrate is arranged on the plane, t refers to a thickness of the ceramic substrate, and L refers to a length of the ceramic substrate,
wherein a relationship between (T-$t_0$), which is a difference between a minimum length T from a highest position of the ceramic substrate to a plane and a thickness to of the ceramic substrate, and a length ($L_0$) of the ceramic substrate satisfies Equation (4) below:

$T-t_0 \leq 0.004L_0$ \qquad Equation (4).

2. The ceramic substrate of claim 1, wherein a thickness of the first electrode layer and a thickness of the second electrode layer are equal to each other, and Equation (2) below is satisfied:

$$85\% \leq \frac{S_1}{S_2} \leq 105\% \qquad \text{Equation (2)}$$

(wherein, $S_1$ refers to an area of the first electrode layer, and $S_2$ refers to an area of the second electrode layer).

3. The ceramic substrate of claim 1, wherein either one or both of the first electrode layer and the second electrode layer include a plurality of sub-electrode layers.

4. The ceramic substrate of claim 3, wherein the plurality of sub-electrode layers are separated from each other by a slit.

5. The ceramic substrate of claim 4, wherein the slit includes either one or two or more of a first slit vertically dividing an electrode layer and a second slit horizontally dividing an electrode layer.

6. The ceramic substrate of claim 1, further comprising a bonding layer on either one side or both sides between the ceramic base material and the first electrode layer and between the ceramic base material and the second electrode layer.

7. A method of manufacturing a ceramic substrate, the method comprising:
preparing a ceramic base material;
forming a first electrode layer on the ceramic base material; and
forming a second electrode layer under the ceramic base material,
wherein Equation (1) below is satisfied:

$$85\% \leq \frac{V_1}{V_2} \leq 105\% \qquad \text{Equation (1)}$$

wherein, $V_1$ refers to a volume of the first electrode layer, and $V_2$ refers to a volume of the second electrode layer,
wherein a camber ratio R defined by Equation (3) below is less than or equal to 0.4%:

$$R = \frac{T-t}{L} \times 100 \qquad \text{Equation (3)}$$

wherein, T refers to a minimum length from a highest position of the entire ceramic substrate including the first electrode and the second electrode to a plane when the ceramic substrate is arranged on the plane, t refers to a thickness of the ceramic substrate, and L refers to a length of the ceramic substrate,
wherein a relationship between (T-$t_0$), which is a difference between a minimum length T from a highest position of the ceramic substrate to a plane and a thickness to of the ceramic substrate, and a length ($L_0$) of the ceramic substrate satisfies Equation (4) below:

$T-t_0 \leq 0.004L_0$ \qquad Equation (4).

8. The method of claim 7, wherein a thickness of the first electrode layer and a thickness of the second electrode layer are equal to each other, and Equation (2) below is satisfied:

$$85\% \leq \frac{S_1}{S_2} \leq 105\% \qquad \text{Equation (2)}$$

(wherein, $S_1$ refers to an area of the first electrode layer, and $S_2$ refers to an area of the second electrode layer).

9. The method of claim 7, wherein either one or both of the first electrode layer and the second electrode layer include a plurality of sub-electrode layers.

10. The method of claim 9, wherein either one or both of the first electrode layer and the second electrode layer are divided by a slit.

11. The method of claim 7, further comprising, prior to forming the first electrode layer and the second electrode layer respectively on and under the ceramic base material, after dividing either one or both of the first electrode layer and the second electrode layer into a sub-electrode layer, forming the sub-electrode layer on the ceramic base material.

12. The method of claim 7, further comprising, after forming the first electrode layer and the second electrode layer respectively on and under the ceramic base material, dividing either one or both of the first electrode layer and the second electrode layer into a sub-electrode layer.

13. The method of claim 12, wherein the dividing into the sub-electrode layer comprises dividing the first electrode layer and the second electrode layer by etching with an etchant, and the etchant comprises either one or two selected from ferric chloride and copper chloride.

\* \* \* \* \*